United States Patent [19]

Hines et al.

[11] Patent Number: 4,860,602
[45] Date of Patent: Aug. 29, 1989

[54] RF TRANSPARENT THERMAL TEST CHAMBER

[75] Inventors: Edward E. Hines, Palm Bay; Lee J. Royer, Satellite Beach; Thomas D. Jehring, Palm Bay; William E. Faulkenberry, Palm Bay; Norvan J. Posey, Palm Bay; Joseph T. Richeson, Melbourne, all of Fla.

[73] Assignee: Harris Corporation, Melbourne, Fla.

[21] Appl. No.: 195,229

[22] Filed: May 18, 1988

[51] Int. Cl.$^4$ .................... G01M 19/00; G01N 25/00
[52] U.S. Cl. .................... 73/865.9; 73/865.6; 165/61; 165/32; 342/165; 343/720; 374/45
[58] Field of Search .................... 73/865.6, 865.9; 342/165; 343/720, 721, 904; 374/1, 45, 57; 165/905, 32, 61, 58

[56] References Cited

U.S. PATENT DOCUMENTS

| | | | |
|---|---|---|---|
| 3,504,736 | 4/1970 | Tausch | 165/2 |
| 4,083,238 | 4/1978 | Dick | 73/167 |
| 4,253,515 | 3/1981 | Swiatosz | 165/61 |
| 4,377,733 | 3/1983 | Yamaguchi et al. | 374/117 X |
| 4,632,127 | 12/1980 | Sterzer | 374/121 X |
| 4,632,128 | 12/1986 | Paglione et al. | 374/121 X |
| 4,645,358 | 2/1987 | Blume | 374/9 |

Primary Examiner—Tom Noland
Attorney, Agent, or Firm—John L. DeAngelis, Jr.

[57] ABSTRACT

A thermally insulated test chamber for performing antenna testing over a broad frequency range. An antenna to be tested is placed within the test chamber, which is constructed of non-RF-reflective styrofoam sheets surrounding the antenna on all sides. The air in the test chamber is heated or cooled, as desired, for testing the antenna over a range of temperatures.

6 Claims, 2 Drawing Sheets

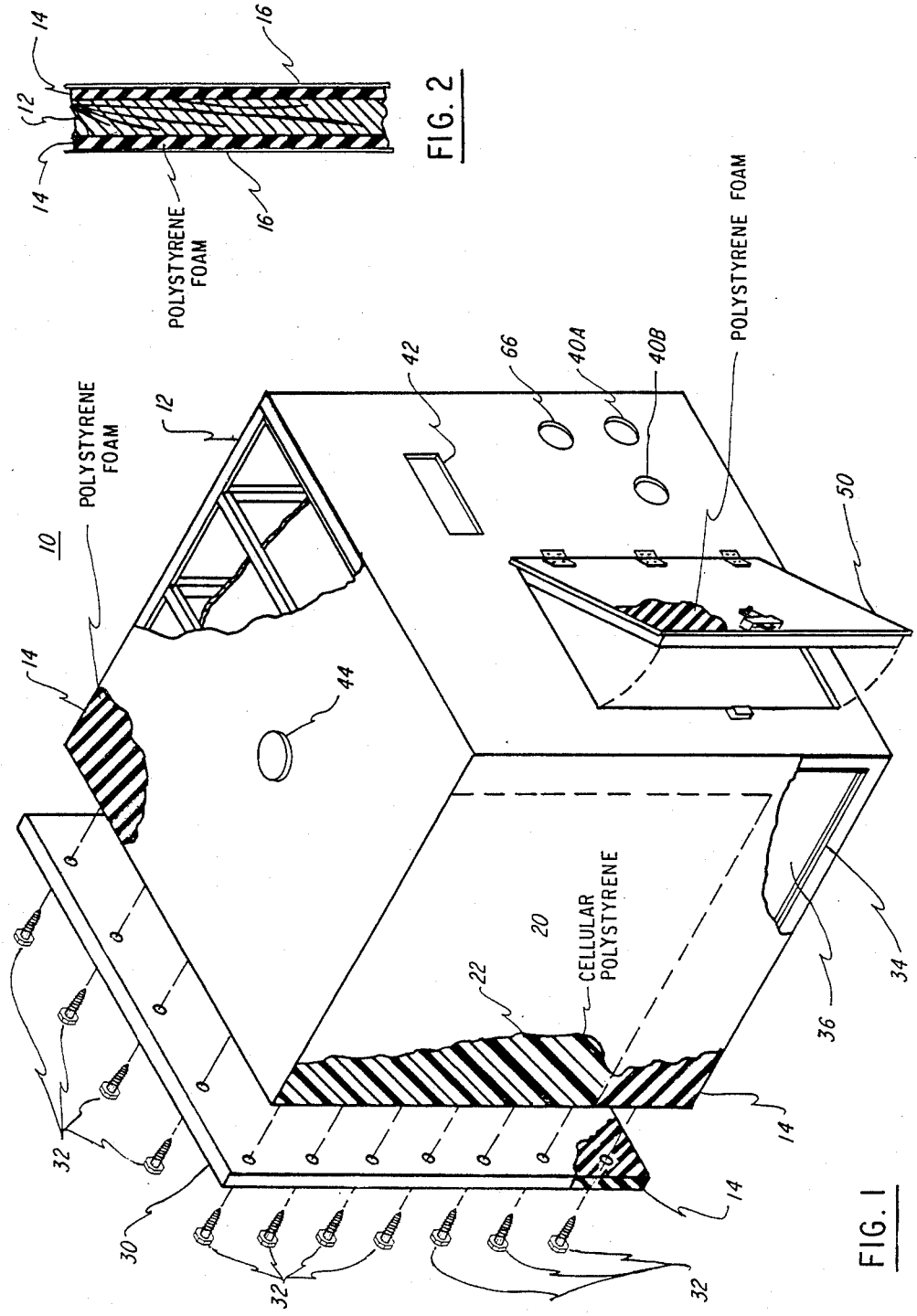

RF TRANSPARENT THERMAL TEST CHAMBER

This invention was made with Government support under Contract No. DAAK-79-C-0261 awarded by the Department of the Army. The Government has certain rights in this invention.

FIELD OF THE INVENTION

This invention relates to a thermally insulated test chamber that allows electromagnetic energy to propagate through the thermally insulated non-reflective test chamber walls.

BACKGROUND OF THE INVENTION

In those situations where temperature extremes may impair the operation of an antenna system, it is necessary to completely characterize the parameters of the system by testing it over its operational temperature range. Large walk in thermal test chambers are well known for testing the performance of electronic components and systems over a temperature range. To provide insulation from the surrounding ambient atmosphere, these prior art test chambers are constructed of insulated metallic walls. But the metallic walls render these prior art systems unacceptable for testing antenna characteristics over a temperature range due to the reflection and absorption of incoming and outgoing RF signals by the metal walls. For example, it is necessary to conclusively demonstrate the ability of a movable dish antenna to track a distant non-stationary terminal over a wide temperature range. To perform this test the ground based antenna terminal must be placed in a thermally-insulated chamber in the far field of the incoming (or out-going) signal from the non-stationary terminal. During the test the dish antenna is moved to track the non-stationary terminal. It is impossible to perform such a test in the prior art test chambers due to the reflection and attenuation of the signals caused by the metallic walls.

The only known prior art technique for directly demonstrating the operation of these radio links is to locate the antenna system within an enclosure and behind a plexiglass window, so the RF energy propagates through the window. This technique does not provide the necessary thermal insulation to test the antenna over large deviations from ambient temperature. Indirect test methods include hand-wiring the radio link between the antenna system and the distant terminal to demonstrate system performance. But, this prior art technique is not acceptable because it substitutes a hard-wired link for the radio link that is undergoing testing. It is also known to analyze system performance at a given temperature and extrapolate its performance over the expected operational temperature range. This too, may introduce unforseen errors into the test results.

SUMMARY OF THE INVENTION

These disadvantages of the prior art are overcome by using the present invention to provide a direct test of antenna performance over a wide temperature range. The present invention is a thermal test chamber, constructed of non-RF-reflective material, that can be heated or cooled as desired. The antenna system under test is placed inside the chamber and the chamber is heated or cooled as required to test the antenna. Preferably, the test chamber is constructed of styrofoam; the radio frequency (RF) signal propagates through the styrofoam test chamber walls with minimal reflection and absorption. In one embodiment the test chamber includes a window section constructed of a special grade of styrofoam to further minimize RF reflection and absorption.

BRIEF DESCRIPTION OF THE DRAWINGS

The present invention can be more easily understood, and the further advantages and uses thereof more readily apparent, when considered in view of the description of the preferred embodiments and the following figures in which:

FIG. 1 depicts a cutaway view of the test chamber;

FIG. 2 is a cross section of a test chamber wall shown in FIG. 1; and

DESCRIPTION OF THE PREFERRED EMBODIMENTS

Figure 3:
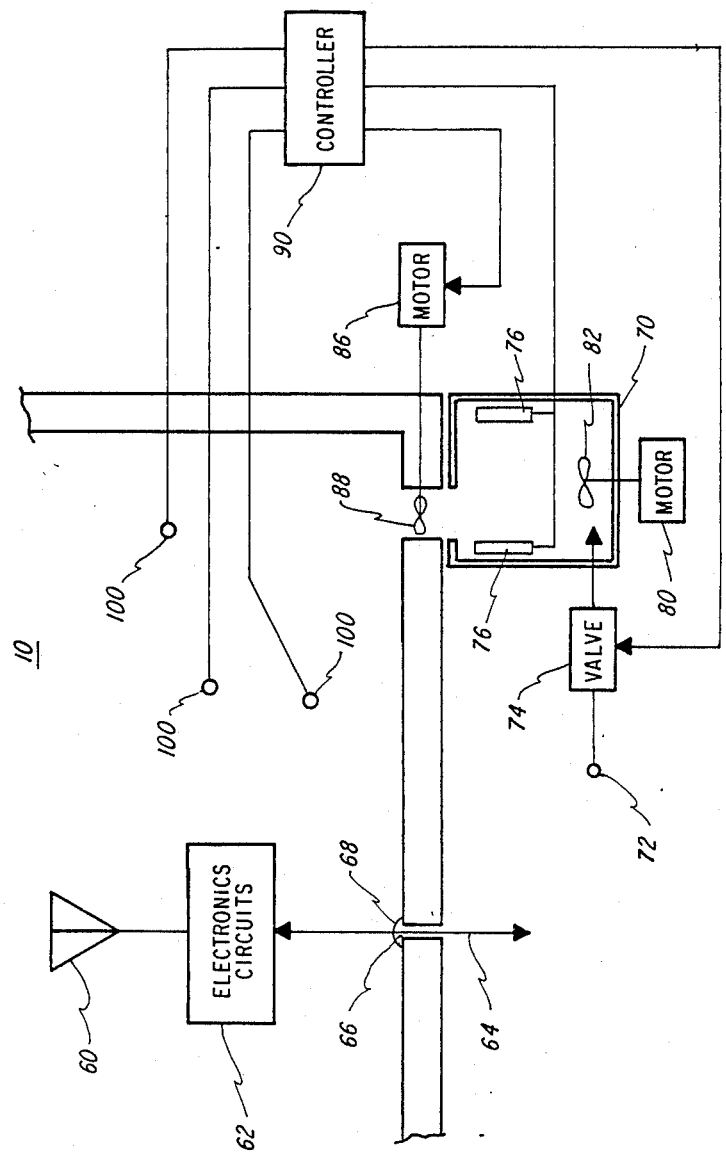
FIG. 3 is a block diagram of a test setup using the test chamber of FIG. 1.

FIG. 1 depicts an RF transparent thermal test chamber 10 constructed according to the teachings of the present invention. The test chamber 10 is constructed of a frame of wooden members 12 with polystyrene foam insulation 14 attached to both the inside and outside surfaces of the frame. The polystyrene foam insulation 14 provides thermal insulation with little or no reflection or absorption of RF energy. This creates an air gap between the inside and outside surfaces of the test chamber 10 for improved thermal insulation. FIG. 2 shows the polystyrene foam insulation 14 and wooden members 12 in cross section. In one embodiment, the polystyrene foam insulation 14 is in the form of 4 feet by 8 feet sheets of construction grade styrofoam, 2 inches thick, manufactured by Cellofoam Southeast, Ocala, Fla. 32672 and Imperial Foam, Daytona Beach, Fla. Styrofoam blocks could also be used to build the insulated walls. The preferred construction technique includes gluing these sheets to the wooden members 12 using any of the well known adhesives suitable for this purpose. The sheets are also glued to each other at the joints between sheets. To provide a vapor barrier for the test chamber 10, plastic 16 is attached to both the inside and outside surfaces of the polystyrene foam insulation 14. This construction is illustrated in the cross sectional view of FIG. 2. In one embodiment the plastic 16 is 10 mils thick and in sheet form. The plastic 16 is taped at the edges where the individual sheets come together. The plastic 16 is available from Sunbelt Plastics, Monroe, La., 71211, or Textrude, Houston, Tex.

In one embodiment, the test chamber 10 includes a window section 20. In this embodiment the antenna under test is placed within the test chamber 10 in such a way that most of the RF energy propagates through the window section 20. The window section 20 is formed of a cellular polystyrene material 22, which is a non-metallic material with low moisture content and a low RF absorption index. The cellular polystyrene 22 does not shift the boresight, reflect, refract, distort or attenuate the RF signal to any measurable extent. Thus the cellular polystyrene material 22 is used in those applications demanding extremely accurate measurements. The cellular polystyrene material 22 is available from Soule Company, Tampa, Fla. and is generically known as extruded polystyrene decorative billet. To provide test results that are as accurate as possible, there are also no wooden members 12 located in the area of the window section 20. The window section 20 occupies only a portion of one side of the test chamber 10; this area is determined by the size of the antenna to be tested within the test chamber 10.

The test chamber 10 includes a removable end panel 30 constructed of the wooden members 12, polystyrene foam insulation 14, and plastic 16. The removable end panel 30 is attached to the test chamber 10 using a plurality of lag bolts 32. The cutaway section of the rear end panel 30 illustrated in FIG. 1 reveals a floor 34 constructed of wooden sheets 36 layed atop polystyrene foam insulation, which is not visible in FIG. 1.

The test chamber 10 includes an air return 42 through which hot or cold air is pumped into the test chamber 10 from an environmental chamber 70. Air is returned to the environmental chamber 70 via air intakes 40A and 40B. The test chamber 10 also includes a pressure relief vent 44 that opens when the inside pressure reaches a predetermined value.

Access into the test chamber 10 is provided through a personnel door 50, which is held in place by a friction fit in the opening. The personnel door 50 is constructed of wooden members 12, polystyrene foam insulation 14, and the plastic 16 as used for the other portions of the test chamber 10. The personnel door 50 is tapered on all edges for a secure fit into the opening. The joint is sealed with a tape strip (not shown in FIG. 1) applied over the exposed seam. An opening 66 is included for passing conductors for connection to the antenna under test.

FIG. 3 illustrates the temperature control scheme for the present invention. An antenna 60 that is to be tested over a wide temperature range is shown within the test chamber 10. The antenna interfaces with electronic circuits 62, and test signals are fed to and received from the electronic circuits 62 through a conductor 64, which exits the test chamber 10 through the opening 66. Insulation, shown generally as reference character 68, must be packed around the opening 66 to minimize heat flow through the opening 66.

FIG. 3 also shows an environmental chamber 70 for injecting hot or cold air into the test chamber 10. In one embodiment the environmental chamber 70 has the capacity to both heat and cool the test chamber 10. If required to assist the cooling system of the environmental chamber 70, liquid nitrogen is supplied to the environmental chamber 70 from a tank 72 via a valve 74. In another embodiment a mechanical refrigeration system is used to supply chilled air for injection into the test chamber 10. Alternatively, the air in the environmental chamber 70 is heated by activating heaters 76. A motor 80 operates a fan 82 for circulating the hot or cold air in the environmental chamber 70. A motor 86 operates a squirrel cage fan 88 for injecting the hot or cold air from the environmental chamber 70 into the test chamber 10.

A controller 90 monitors the temperature in the test chamber 10 with a plurality of thermocouples 100. Based on the temperatures in the test chamber 10 and the desired temperature for the test, the controller 90 controls the motor 86 to inject more hot or cold air into the test chamber 10. The controller 90 also activates or deactivates, as required, the heaters 76 and opens or closes the valve 74 for controlling the temperature in the environmental chamber 70. In one embodiment, the test chamber 10 provides antenna testing from $-38°$ C. to $+55°$ C.

In use, an antenna to be tested over a range of temperatures is placed into the test chamber 10 through the opening created by removing the removable end panel 30. The removable end panel 30 is reattached to the test chamber 10 and the antenna is connected to electronic systems via the conductors 64 for the test. During the test, the antenna may be rotated or pitched as desired to receive signals from or transmit signals to a distant terminal. The temperature in the test chamber 10 may be changed as desired to test the antenna over its operational temperature range.

The required test temperature range and the ambient temperature outside the test chamber 10 determine the type and thickness of insulation material used in constructing the test chamber 10. Other types of insulation include fiberglass bats (from Owens-Corning), and styrofoam blocks, chips or pieces. The window section 20 can be constructed of other material types depending upon the test frequencies. In addition to the cellular polystyrene used in the preferred embodiment, plexiglass could also be used for the transparent section 20.

Although several embodiments in accordance with the present invention have been shown and described, it is understood that the same is not limited thereto but is susceptible of numerous changes and modifications that are known to a person skilled in the art, and we therefore do not wish to be limited to the details shown and described herein, but intend to cover all such changes and modifications as are obvious to one of ordinary skill in the art.

What is claimed is:

1. A thermal test chamber for testing an antenna over a predetermined temperature range, comprising:
   a shell of thermal insulating non-RF reflective material for enclosing the antenna;
   a window portion in said shell, wherein said window portion is constructed of a material that provides thermal insulation and is substantially transparent to RF energy; and
   means for controlling the temperature within said shell.

2. The thermal test chamber of claim 1 wherein the shell includes a removable panel to provide access to the interior of the test chamber.

3. The thermal test chamber of claim 1 wherein the means of controlling the temperature includes:
   means for providing hot air;
   means for providing cold air; and
   means for injecting the hot or cold air into the test chamber at a controlled rate.

4. The thermal test chamber of claim 1 wherein said window is constructed of cellular polystyrene.

5. The thermal test chamber of claim 1 wherein the window is constructed of plexiglass.

6. A thermal test chamber for testing an antenna over a predetermined temperature range, comprising:
   a frame of non-RF reflective material;
   polystyrene foam insulating material attached to the inside and the outside surfaces of said frame so as to form an air gap between said inside and said outside surfaces;
   and means for controlling the temperature within said test chamber.

* * * * *